United States Patent [19]

Ahne et al.

[11] Patent Number: 4,654,415

[45] Date of Patent: Mar. 31, 1987

[54] METHOD FOR THE PREPARATION OF POLYIMIDE AND POLYISOINDOLOQUINAZOLINE DIONE PRECURSORS

[75] Inventors: Hellmut Ahne, Röttenbach; Eberhard Kühn, Hemhofen, both of Fed. Rep. of Germany

[73] Assignee: Siemens Aktiengesellschaft, Berlin and Munich, Fed. Rep. of Germany

[21] Appl. No.: 716,672

[22] Filed: Mar. 27, 1985

[30] Foreign Application Priority Data

Mar. 29, 1984 [DE]  Fed. Rep. of Germany ....... 3411660

[51] Int. Cl.$^4$ .............................................. C08G 73/12
[52] U.S. Cl. ................................. 528/351; 528/352; 528/353; 528/192
[58] Field of Search ................ 528/351, 352, 353, 192

[56] References Cited

U.S. PATENT DOCUMENTS

| Re. 30,186 | 1/1980 | Rubner et al. | 430/325 |
|---|---|---|---|
| 3,957,512 | 5/1976 | Kleeberg et al. | 430/325 |
| 4,168,366 | 9/1979 | D'Alelio | 528/353 |
| 4,385,165 | 5/1983 | Ahne et al. | 528/53 |
| 4,416,973 | 11/1983 | Goff | 430/281 |
| 4,438,273 | 3/1984 | Landis | 528/125 |
| 4,447,596 | 5/1984 | Makino et al. | 528/125 |
| 4,485,231 | 11/1984 | Landis | 528/125 |
| 4,485,234 | 11/1984 | Makino et al. | 528/125 |
| 4,495,342 | 1/1985 | Landis | 528/125 |
| 4,496,711 | 1/1985 | Landis | 528/125 |
| 4,551,522 | 11/1985 | Fryd et al. | 528/125 |

*Primary Examiner*—Morton Foelak
*Assistant Examiner*—M. L. Moore
*Attorney, Agent, or Firm*—Kenyon & Kenyon

[57] ABSTRACT

Oligomeric and/or polymeric radiation-sensitive polyimide and polyisoindoloquinazoline dione precursors which are soluble in organic solvents, and are of high purity, i.e. in particular chloride-free, are produced simply by first reacting an aromatic and/or heterocyclic tetracarboxylic acid dianhydride with an olefinically unsaturated alcohol to an olefinically unsaturated tetracarboxylic acid diester, and then reacting the latter, in the presence of a carbodiimide, with a diamino compound or a diamino compound having at least one ortho-positioned amino group. The radiation-sensitive precursors thus produced are suitable, for instance, for the production of highly heat-resistant relief structures.

10 Claims, No Drawings

METHOD FOR THE PREPARATION OF POLYIMIDE AND POLYISOINDOLOQUINAZOLINE DIONE PRECURSORS

BACKGROUND OF THE INVENTION

The invention relates to a method for the preparation of oligomeric and/or polymeric radiation-sensitive precursors of polyimides and polyisoindoloquinazoline diones, as well as to the use of these radiation-sensitive precursors.

Soluble radiation-sensitive polyimide and polyisoindoloquinazoline dione precursors are required, for example, in the simple photolithographic production of highly heat-resistant structured protective and insulating layers used in semiconductor engineering. Economical production methods are sought which do not require any expensive purification processes, especially for the removal of chloride.

Polyimide and polyisoindoloquinazoline dione precursors of the type mentioned above, which are soluble in organic solvents, are known for example, from U.S. Pat. No. 3,957,512. These precursors are poly-condensation products of polyfunctional carbocyclic or heterocyclic compounds containing radiation-sensitive radicals, and diamines. The compounds containing radiation-sensitive radicals have two carboxylic acid groups suitable for condensation reactions, and partly in ortho- or peri-position thereto, radiation-sensitive radicals bound to carboxyl groups in ester fashion. The diamines to be reacted with these compounds have at least one cyclic structural element.

Radiation-sensitive polyimide precursors are produced in particular by adding unsaturated alcohols, such as allyl alcohol, to tetracarboxylic acid dianhydrides, such as pyromellitic acid dianhydride; transforming the free carboxylic acid groups of the resulting diesters into acid chloride groups; and subjecting the formed diester-bis-acid chlorides to a poly-condensation reaction with a diamine, which is usually aromatic. With the use of diamino compounds which contain ortho-positioned amido groups, polyisoindoloquinazoline diones are formed analogously.

The known production method, therefore, requires several reaction steps, and also requires that the processes be carried out at low temperatures. Additionally, with the use of acid chlorides intensive purification of the reaction products is necessary.

For the preparation of oligomeric and/or polymeric radiation-sensitive precursors of polyimides and polyisoindoloquinazoline diones a further method is known in which olefinically unsaturated monoepoxides are caused to react with carboxyl group-containing polyaddition products of aromatic and/or heterocyclic tetracarboxylic acid dianhydrides and diamino compounds, or respectively diamino compounds having at least one ortho-positioned amido group (U.S. Pat. No. 4,385,165). Often, however, the reactions do not proceed completely, so that the precursors obtained in this manner may be impaired with respect to their radiation-sensitive nature.

SUMMARY OF THE INVENTION

It is an object of the invention to provide a method which permits, in a simple manner, the preparation of polyimide and polyisoindoloquinazoline dione precursors which are soluble in organic solvents and are at the same time radiation-sensitive, and of high purity, i.e. in particular, chloride-free.

According to the invention, this is achieved by reacting an aromatic and/or heterocyclic tetracarboxylic acid dianhydride with an olefinically unsaturated alcohol to form an olefinically unsaturated tetracarboxylic acid diester, and then reacting the tetracarboxylic acid diester with a diamino compound, or with a diamino compound having at least one ortho-positioned amido group, in the presence of a carbodiimide.

DETAILED DESCRIPTION OF THE INVENTION

In the context of the present patent application, "tetracarboxylic acid dianhydride" means compounds which comprise at least two acid anhydride groups. The term "diamino compound" also comprises compounds having the structural element

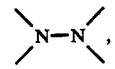

i.e. derivatives of hydrazine. By "diamino compound with at least one ortho-positioned amido group" are understood compounds which carry at least one amido group in ortho position to one of the two amino groups of the diamino compound.

By the method according to the invention, polyimide and polyisoindoloquinazoline dione precursors can be synthesized in a simple manner. These precursors are very radiation-sensitive and hence can be easily cross-linked. The cross-linked products can then be transformed simply by a thermal treatment into highly heat-resistant polyimides or polyisoindoloquinazoline diones.

Generally, the method according to the invention is carried out in a solvent. The tetracarboxylic acid diester is reacted with the diamine, optionally at room temperature, then carbodiimide is added with precipitation of the corresponding urea.

Thereby, high-purity, in particular chloride-free, solutions of the radiation-sensitive precursors are obtained. These precursors are very soluble in organic solvents, particularly in polar solvents with a high flash point. After the urea derivative is separated, obtained in very pure form, the solutions of the precursors are directly ready for further use. Alternatively, the precursors can be isolated as solid resin by precipitation. In any case, from solutions of the precursors, homogeneous layers in a wide range of thicknesses can be produced, and hardened, for example, by UV radiation.

In the method according to the invention, the reaction of the tetracarboxylic acid diester with the diamino compound, or respectively with the diamino compound having at least one amido group is advantageously carried out at room temperature, optionally in the presence of an aminic catalyst. It is also possible to use various diamino compounds conjointly. Preferably, the tetracarboxylic acid diester and the diamino compound are combined at room temperature to form as homogeneous a solution as possible. A carbodiimide is then added in the form of a solution by drops, while stirring. Alternatively, the procedure may take place in stages, in that first an addition product of the carbodiimide and the diester-bis-carboxylic acid is prepared, which is then reacted with the diamine, with precipitation of the urea derivative.

The method according to the invention is easy to carry out with respect to instrumentation. Generally, room temperature is sufficient. Because acid chlorides do not take part in the reaction, expensive purification operations are unnecessary. Moreover, the reaction products, including the urea derivatives obtained as by-products, are present in very pure states. Also of crucial importance to the method according to the invention is the suprising fact that the unsaturated diester-bis-carboxylic acids react so smoothly and completely with the diamines in the presence of carbodiimide, and in particular, also the fact that the unsaturated urea derivatives can be separated efficiently from the precursors.

The polymer precursors produced by the method according to the invention are suitable in particular for the production of structured, highly heat-resistant protective and insulating layers in microelectronics (fine structure production). The precursors are also suited for use as photo resist (cf. the simultaneously filed U.S. patent application "The Preparation of Polyimide and Polyisoindoloquinazoline Dione Relief Structures", Siemens, VPA 84 P 3117 U S).

The radiation-sensitive precursors produced according to the invention generally have the following structure:

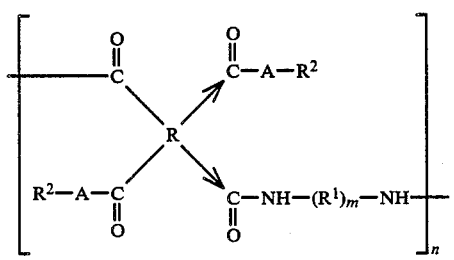

The arrows contained in the formula are to express the fact that the two substituents in question can interchange their position at R. This is of importance for the reason that the R involves a cyclic radical, as explained below.

In the formula, n is an integer from 2 to about 100, and m is 0 or 1. For R, $R^1$, $R^2$, and A the following applies:

R is an optionally halogenated, at least partially aromatic and/or heterocyclic tetravalent, i.e. tetrafunctional, radical, in which two respective valences are arranged adjacently to each other; if the radical R has several aromatic and/or heterocyclic structural elements, the valence pairs are respectively located at the end positions of such structural elements, $R^1$ is an optionally halogenated, divalent, i.e. difunctional, radical of a structure which is aliphatic and/or cycloaliphatic, optionally having heteroatoms,*)

*)and/or a structure which is aromatic and/or heterocyclic;

$R^2$ is an olefinically unsaturated radical, for example, an allylether-containing group, in particular an optionally substituted (meth)acrylic ester-containing group or a propargyl group;

A signifies —O—, or —NH—.

The radicals R, $R^1$, and $R^2$ have in particular the following meanings:

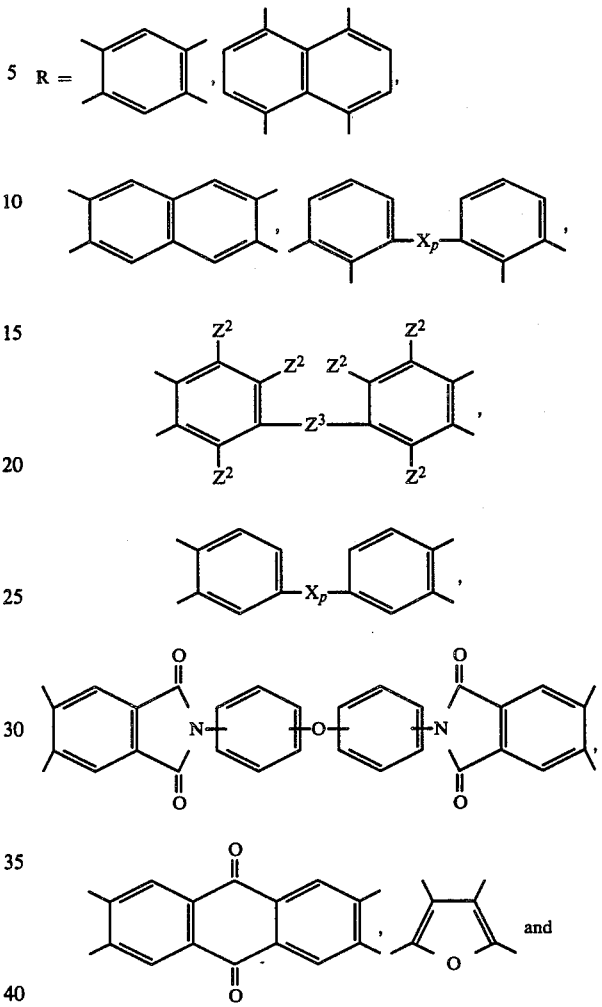

where p=0 or 1, and X stands for one of the following radicals:

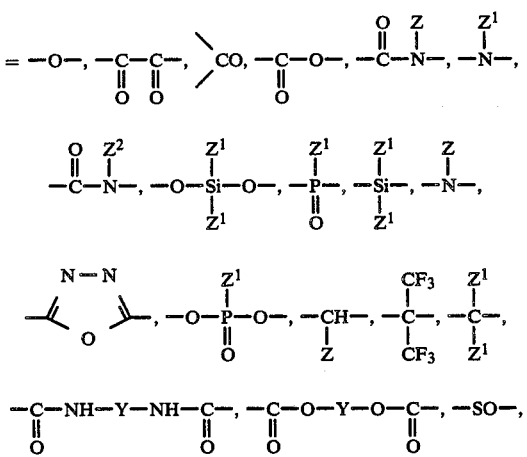

-continued
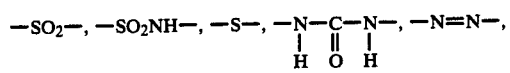
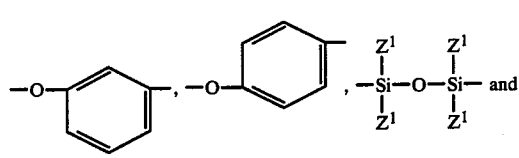
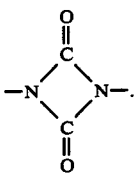
For the other radicals there applies:
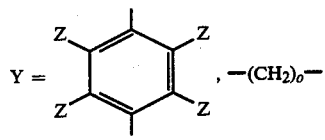
with o=2 to 10, and
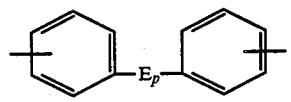
with p=0 or 1,
Z=H or alkyl with 1 to 6 carbon atoms,
$Z^1$=alkyl with 1 to 10 carbon atoms or aryl,
$Z^2$=aryl or heteroaryl, and
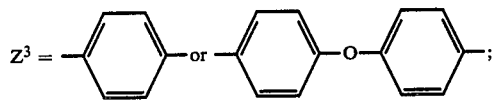
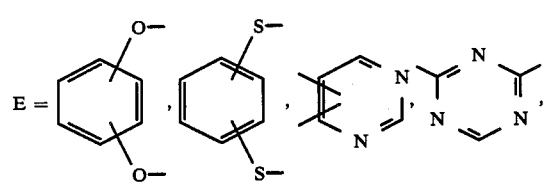
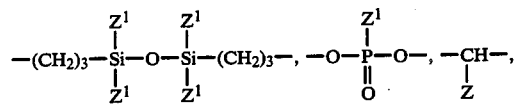
-continued
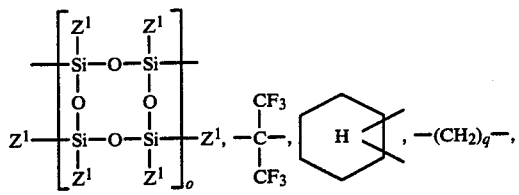
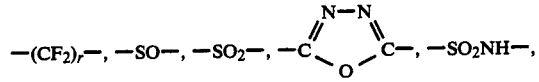
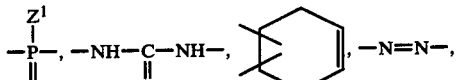
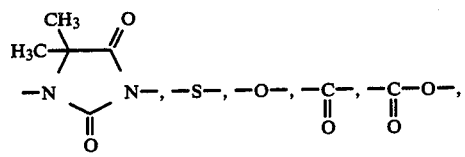
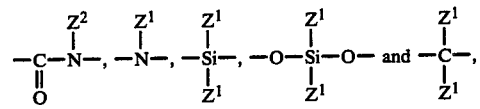
where o=2 to 10, q=2 to 14, and r=2 to 18, and $Z^1$ and $Z^2$ are defined as above;
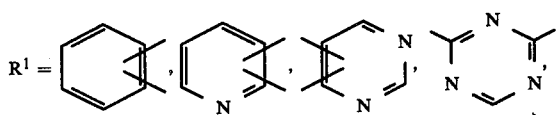
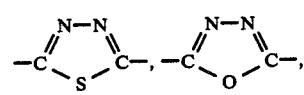
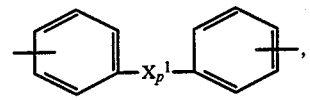
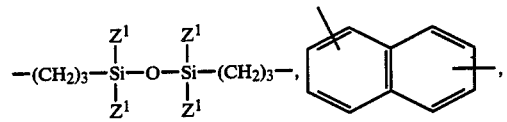
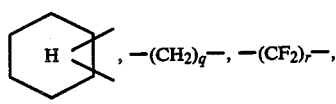
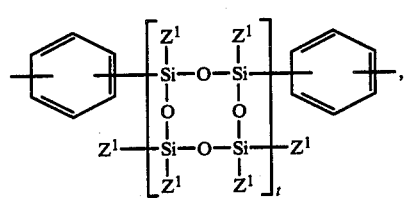

-continued

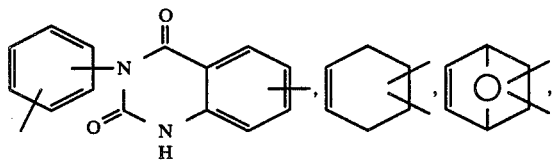

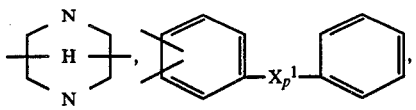

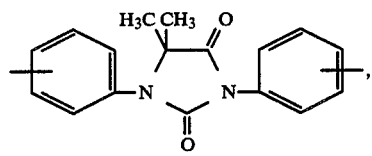

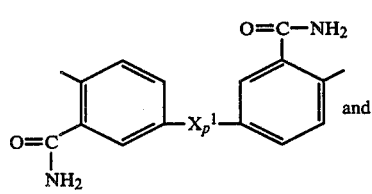

where p=0 or 1, q=2 to 14, r=2 to 18, t=1 to 10, and $Z^1$ is defined as above;

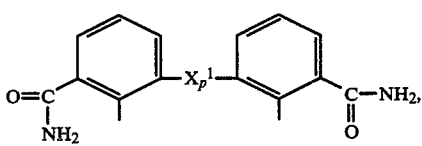

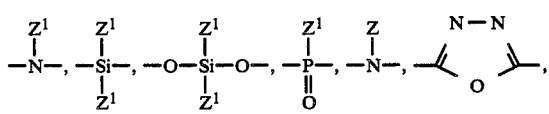

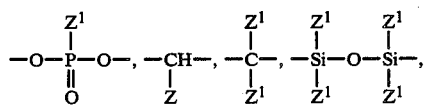

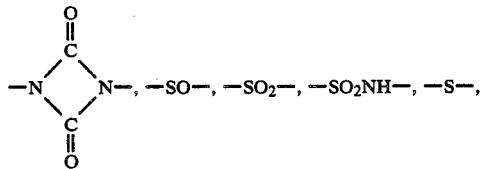

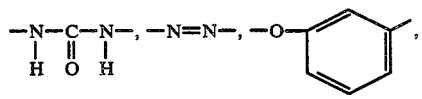

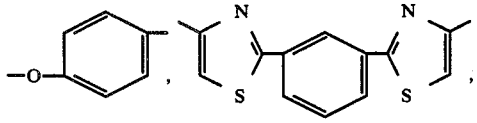

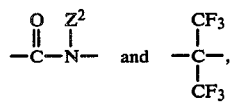

where Z, $Z^1$ and $Z^2$ are defined as above;

$$R^2 = X^2-O-\overset{O}{\underset{\|}{C}}-\overset{Y^2}{\underset{|}{C}}=CH_2,$$

$-X^2-O-(CH_2)_s-NH-\underset{N\underset{O-C-C=CH_2}{\overset{|}{\underset{Y^2}{|}}}}{\overset{N}{\underset{\|}{\bigwedge}}}-O-\overset{O}{\underset{\|}{C}}-\overset{Y^2}{\underset{|}{C}}=CH_2,$ $-X^2-C\equiv CH$, $-X^2-N\overset{\overset{O}{\|}}{\underset{\underset{O}{\|}}{\bigcirc}}$, $-X^2-N\overset{\overset{O}{\|}}{\underset{\underset{O}{\|}}{\bigcirc}}\diamond$, $-X^2-O-CH_2-CH=CH_2$ and $-X^2-O-CH_2-C\equiv CH$;

where s=2 to 16; for the further radicals, the following applies:

$X^2=-(CH_2)_r-$ and
$-CH_2-O-[(CH_2)_r-O]_t-(CH_2)_s-$, and $Y^2=-H, -CH_3, -Cl, -Br$ or $-C\equiv N$, where r=2 to 18, s=2 to 16, and t=1 to 10.

The radiation-sensitive precursors prepared according to the invention are polycondensation products of olefinically unsaturated difunctional diesters with diamines (polyimide precursors) or with o-aminoamides, i.e. diamines having ortho-positioned amido groups (polyisoindoloquinazoline dion precursors). The tetracarboxylic acid dianhydrides preferably used for the preparation of the diesters are the anhydrides of pyromellitic acid and of benzophenone tetracarboxylic acid; among the unsaturated alcohols employed for the same purpose, hydroxyethylacrylate and hydroxyethylmethacrylate are preferred. Also, according to the method of the invention, various tetracarboxylic acid dianhydrides, as well as various diamino compounds, may be used conjointly. Among the diamino compounds, 4,4'-diaminodiphenyl ether is preferred. Among the o-amino amides, 4,4'-diaminodiphenyl-3,3'-dicarboxylic acid amide is preferred. These amines can also be employed to special advantage in combination with one another. The preferably-used carbodiimide is dicyclohexylcarbodiimide; carbodiimides are compounds of the type R'—N=C=N—R".

The precursors produced according to the invention preferably comprise aromatic carboxylic acids as basic components, and therefore result, upon thermal treatment, in polymers having the following structural units:

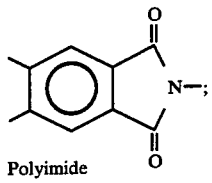

Polyimide

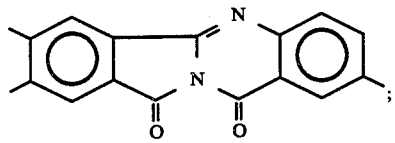

Polyisoindoloquinazolinedione

The term "polyimides" is to include polyesterimides and polyamidimides:

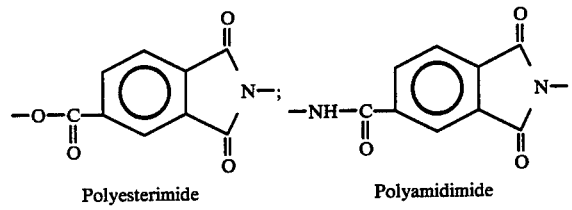

Polyesterimide   Polyamidimide

Apart from the use as photo resist, and for the production of protective and insulating layers, wherein structuring takes place, the precursors according to the invention can also be used generally, in nonstructured form, for the production of protective and insulating coatings.

The invention will now be explained more specifically with reference to embodiment examples.

EXAMPLE 1

Preparation of a radiation-sensitive polyimide precursor 26 parts by weight of hydroxyethylmethacrylate (0.2 mole) and 0.2 parts by weight of 1,4-diazabicyclo(2,2,-2)octane are added with agitation and in the absence of moisture to 32.2 parts by weight of benzophenone tetracarboxylic acid dianhydride (0.1 mole) in 50 parts by volume of gamma-butyrolactone. After the product has been left standing for 16 hours, the titrimetrically determined carboxyl content is 0.22 mole/100 g. Then, a solution of 16 parts by weight of 4,4'-diaminodiphenyl ether (0.08 mole) in 50 parts by volume of N-methylpyrrolidone is added to the reaction solution while stirring. Thereafter, a solution of 36 parts by weight of dicyclohexylcarbodiimide (0.18 mole) in 100 parts by volume of gamma-butyrolactone is added in drops into the reaction solution, whereby dicyclohexylurea precipitates. The reaction solution is then left standing overnight at room temperature. After filtration of the dicyclohexylurea by-product, a viscous resin is obtained, which can be directly processed further as films and foils.

Alternatively, the photoreactive polyimide precursor can be precipitated as a solid resin by letting the resin solution drip into distilled water with agitation. By filtration, a light-yellow powder is obtained, which is dried under vacuum at a pressure of $1.3 \times 10^4$ Pa and a temperature of $\leq 40°$ C. The viscosity index is 15.3 ml/g. The IR spectrum shows the absorption typical for methacrylates at 950 and 1630 cm$^{-1}$. A film 5 μm thick, produced by centrifuging, hardens within 5 minutes under exposure with an extra-high pressure mercury lamp (350 W).

EXAMPLE 2

Preparation of a radiation-sensitive polyisoindoloquinazoline dione precursor 46.4 parts by weight of hydroxyethylacrylate (0.4 mole) and 0.4 parts by weight of 1,4-diazabicyclo(2,2,-2)octane are added to 43.6 parts by weight of pyromellitic acid dianhydride (0.2 mole) in 100 parts by volume of N-methylpyrrolidone with agitation and in the absence of moisture. The reaction solution is left standing at room temperature for 15 hours. 51.7 parts by weight of 4,4'-diaminodiphenyl-3,3'-dicarboxylic acid amide (0.19 mole) in 100 parts by volume of a dimethylacetamide/N-methylpyrrolidone mixture (with a volumetric ratio of 1:1) are then added to the diester solution. A solution of 74 parts by weight of dicyclohexylcarbodiimide (0.36 mole) in 50 parts by volume of N-methylpyrrolidone is then added in drops while stirring and cooling. Dicyclohexyl urea precipitates, with a corresponding slight evolution of heat. After a post-reaction time of 5 hours, the dicyclohexyl urea is separated by filtration. The viscous solution can be processed as a film by pouring it on an aluminum sheet and subsequently drying it in a vacuum drying cabinet at a pressure of $1.3 \times 10^4$ Pa and a temperature of $\leq 40°$ C. By exposing a 7 μm thick film with a 500 W extra-high pressure mercury lamp, the film is hardened within 4 minutes.

In accordance with Example 1, the radiation-sensitive polyisoindoloquinazoline dione precursor can also be isolated as a solid resin. The absorption bands typical for acrylates at 950 and 1630 cm$^{-1}$ are present in the IR spectrum.

What is claimed is:

1. A method for the preparation of oligomeric and/or polymeric radiation-sensitive precursors of polyimides and polyisoindoloquinazoline diones, comprising the steps of reacting an aromatic and/or heterocyclic tetracarboxylic acid dianhydride with an olefinically unsaturated alcohol at about a stoichiometric ratio to produce an olefinically unsaturated tetracarboxylic acid diester, and reacting at about a stoichiometric ratio the tetracarboxylic acid diester with a diamino compound or with a diamino compound having at least one ortho-positioned amido group, in the presence of about a stoichiometric amount of a carbodiimide.

2. A method according to claim 1, wherein the reaction of the tetracarboxylic acid diester with the diamino compound, or with the diamino compound having at least one amido group, is carried out at room temperature, optionally in the presence of a catalyst.

3. A method according to claim 2, wherein the reaction of the tetracarboxylic acid diester with the diamino compound, or with the diamino compound having at least one amido group, is carried out in the presence of a catalyst.

4. A method according to claim 1, wherein the carbodiimide is dicyclohexylcarbodiimide.

5. A method according to claim 1, wherein the tetracarboxylic acid dianhydride is pyromellitic acid anhydride or benzophenone tetracarboxylic acid anhydride.

6. A method according to claim 1, wherein the diamino compound is 4,4'-diaminodiphenylether.

7. A method according to claim 1, wherein the diamino compound having at least one amido group is 4,4'-diamino diphenyl-3,3'-dicarboxylic acid amide.

8. A method according to claim 1 wherein the olefinically unsaturated alcohol is hydroxyethylacrylate or hydroxyethyl methacrylate.

9. A method for preparation of a protective or insulating layer on a substrate which comprises preparing an oligomeric and/or polymeric, radiation-sensitive precursor of polyimides or a polyisoindoloquinazoline dione by the reaction steps according to claim 1, forming the oligomeric and/or polymeric, radiation-sensitive precursor into a layer on the substrate and irradiating the layer with ultraviolet light to produce the protective or insulating layer on the substrate.

10. A method according to claim 9 wherein the substrate is an electrical structural part.

* * * * *

UNITED STATES PATENT AND TRADEMARK OFFICE
CERTIFICATE OF CORRECTION

PATENT NO. : 4,654,415

DATED : March 31, 1987

INVENTOR(S) : AHNE et al.

It is certified that error appears in the above-identified patent and that said Letters Patent is hereby corrected as shown below:

Column 1, line 9, replace "oligomcric" by --oligomeric--.

Column 3, line 11, replace "suprising" by --surprising--.

Column 8, line 42, replace ")$_r$+O+$_t$" by --)$_r$[O]$_e$--.

Column 12, line 7, replace "polyimides" by --polyimide--.

Signed and Sealed this

Twenty-second Day of November, 1988

*Attest:*

DONALD J. QUIGG

*Attesting Officer*     *Commissioner of Patents and Trademarks*